(12) United States Patent
Anguelouch et al.

(10) Patent No.: US 8,097,846 B1
(45) Date of Patent: Jan. 17, 2012

(54) METROLOGY AND 3D RECONSTRUCTION OF DEVICES IN A WAFER

(75) Inventors: Alexandre Anguelouch, Fremont, CA (US); Lei Wang, Fremont, CA (US); Chester Xiaowen Chien, San Jose, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 543 days.

(21) Appl. No.: 12/392,887

(22) Filed: Feb. 25, 2009

(51) Int. Cl.
*G01N 23/00* (2006.01)
*H01J 37/252* (2006.01)
*H01J 37/30* (2006.01)

(52) U.S. Cl. ..... 250/307; 250/306; 250/311; 250/492.2; 250/492.21

(58) Field of Classification Search ............. 250/307, 250/306, 311, 492.2, 492.21; 382/145, 132; 700/121
See application file for complete search history.

(56) References Cited

U.S. PATENT DOCUMENTS

| | | | |
|---|---|---|---|
| 6,252,227 B1 | 6/2001 | Tseng et al. | |
| 6,521,902 B1 | 2/2003 | Chang et al. | |
| 6,723,650 B1 | 4/2004 | Chang | |
| 6,728,591 B1* | 4/2004 | Hussey et al. | 700/121 |
| 7,323,350 B2 | 1/2008 | Dulay et al. | |
| 2003/0127424 A1 | 7/2003 | Clinton et al. | |
| 2004/0066575 A1 | 4/2004 | Hirooka | |
| 2005/0202675 A1 | 9/2005 | Lu et al. | |
| 2006/0073618 A1 | 4/2006 | Dulay et al. | |
| 2006/0289749 A1 | 12/2006 | Hwu | |
| 2009/0296073 A1* | 12/2009 | Wagganer | 356/72 |
| 2010/0177947 A1* | 7/2010 | Hayashi et al. | 382/132 |

* cited by examiner

*Primary Examiner* — Nikita Wells

(57) ABSTRACT

A method for measuring three-dimensional devices in a wafer comprises the step of obtaining a plurality of cross-sectional images of a corresponding plurality of three-dimensional devices in the wafer. The plurality of three-dimensional devices have essentially identical geometries. Each cross-sectional image is obtained from a plane in the corresponding three-dimensional device at a predetermined distance from a fiducial mark thereof. The predetermined distance is different for each of the plurality of cross-sectional images. The method further comprises the step of determining the geometries of the plurality of three-dimensional devices based on the cross-sectional images thereof.

21 Claims, 7 Drawing Sheets

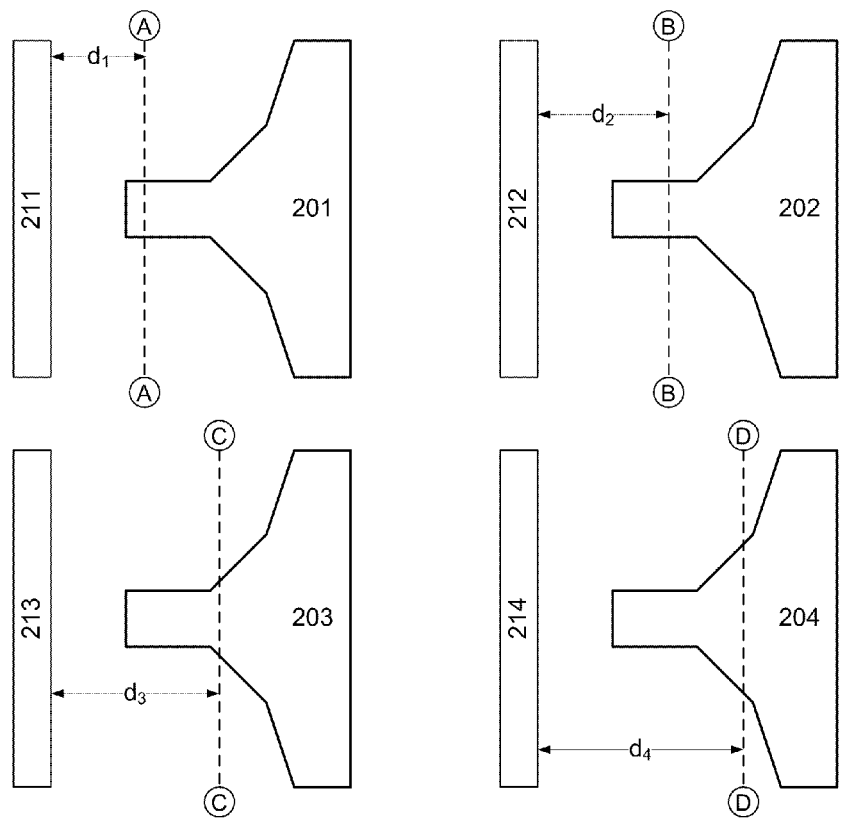
Fig. 3a
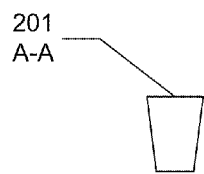
Fig. 3b
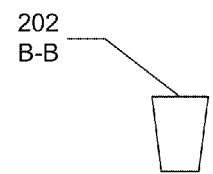
Fig. 3c
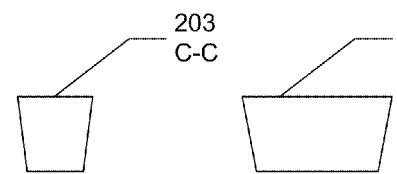
Fig. 3d       Fig. 3e

METROLOGY AND 3D RECONSTRUCTION OF DEVICES IN A WAFER

FIELD OF THE INVENTION

The present invention generally relates to metrology and, in particular, relates to metrology and 3D reconstruction of devices in a wafer.

BACKGROUND OF THE INVENTION

The performance of many devices fabricated using semiconductor methods is critically dependent upon the three-dimensional (3D) structure thereof. For example, the performance of a perpendicular magnetic recording (PMR) write pole is highly dependent upon the 3D shape of the write pole near the air bearing surface (ABS), the nose length, and pole flare and/or pinching. To obtain information about the efficacy of manufacturing methods of these and other devices, it is desirable to measure the 3D structure of these devices when comparing the performance of different designs.

One approach to measuring the 3D structure of a device in a wafer involves a "slice and view" (SnV) method employing a dual beam Focused-Ion-Beam Scanning Electron Microscope (FIB/SEM). In this method, the dual beam FIB/SEM is employed to produce a series of cross-sectional views of the 3D structure. Successive cuts are made in the device, and a cut placement (CP) position is measured after each cut.

This may be more easily understood with reference to FIGS. 1a-1e, which illustrate the SnV approach to measuring the 3D structure of a PMR write pole. As can be seen with reference to FIG. 1a, several cuts are made using a dual beam FIB/SEM along different planes (i.e., A-A, B-B, C-C and D-D) intersecting the write pole 100. Each cut is made a different distance from a fiducial structure 101 of the write pole, whose position relative to the ABS is known a priori. In this regard, the cut made in plane A-A is a distance $d_1$ from fiducial 101, the cut made in plane B-B is a distance $d_2$ from fiducial 101, the cut made in plane C-C is a distance $d_3$ from fiducial 101, and the cut made in plane D-D is a distance $d_4$ from fiducial 101. Each of these cuts can provide a cross sectional view of write pole 100, as illustrated in FIGS. 1b-1e. In this regard, a cross-sectional view of write pole 100 in plane A-A is illustrated in FIG. 1b, a cross-sectional view of write pole 100 in plane B-B is illustrated in FIG. 1c, a cross-sectional view of write pole 100 in plane C-C is illustrated in FIG. 1d, a cross-sectional view of write pole 100 in plane D-D is illustrated in FIG. 1e. From these cross-sectional view of write pole 100, information regarding the 3D structure thereof can be determined.

Unfortunately, the foregoing SnV method can generate incorrect measurements in small devices in a wafer, such as PMR write poles, as each succeeding CP measurement may be distorted by the preceding cuts (e.g., the measurement of the CP may give inaccurate results as the relative distance between the fiducial and the new cut may have been changed by the intervening cuts).

SUMMARY OF THE INVENTION

Various embodiments of the present invention solve the foregoing problem by providing metrology and 3D reconstruction methods for measuring three-dimensional devices in a wafer. Rather than only making successive cuts in a single device, successive cuts are made in nearby devices on the wafer. Because these nearby devices are designed to be geometrically identical (e.g., a wafer may contain thousands of write poles of a single design), a composite 3D reconstruction utilizing cross-sectional measurements of separate devices can provide information about the geometry of all the devices.

According to one aspect of the subject disclosure, a method for measuring three-dimensional devices in a wafer comprises the step of obtaining a plurality of cross-sectional images of a corresponding plurality of three-dimensional devices in the wafer. The plurality of three-dimensional devices have essentially identical geometries. Each cross-sectional image is obtained from a plane in the corresponding three-dimensional device at a predetermined distance from a fiducial mark thereof. The predetermined distance is different for each of the plurality of cross-sectional images. The method further comprises the step of determining the geometries of the plurality of three-dimensional devices based on the cross-sectional images thereof.

According to another aspect of the subject disclosure, a method for measuring three-dimensional devices in a wafer comprises the steps of forming a first trench having a first facet a first predetermined distance from a first fiducial mark of a first three-dimensional device in the wafer and measuring a first cross-sectional view of the first three-dimensional device at the first facet. The method further comprises the step of forming a second trench having a second facet a second predetermined distance from a second fiducial mark of a second three-dimensional device in the wafer. The second three-dimensional device is essentially identical in shape to the first three-dimensional device. The method further comprises the steps of measuring a second cross-sectional view of the second three-dimensional device at the second facet, and determining a geometry of the first and second three-dimensional devices based on the measured first and second cross-sectional views.

According to another aspect of the subject disclosure, a machine readable medium carries one or more sequences of instructions for measuring three-dimensional devices in a wafer. Execution of the one or more sequences of instructions by one or more processors causes the one or more processors to perform the step of obtaining a plurality of cross-sectional images of a corresponding plurality of three-dimensional devices in the wafer. The plurality of three-dimensional devices have essentially identical geometries. Each cross-sectional image is obtained from a plane in the corresponding three-dimensional device at a predetermined distance from a fiducial mark thereof. The predetermined distance is different for each of the plurality of cross-sectional images. Execution of the one or more sequences of instructions by the one or more processors further causes the one or more processors to perform the step of determining the geometries of the plurality of three-dimensional devices based on the cross-sectional images thereof.

It is to be understood that both the foregoing summary of the invention and the following detailed description are exemplary and explanatory and are intended to provide further explanation of the invention as claimed.

BRIEF DESCRIPTION OF THE DRAWINGS

The accompanying drawings, which are included to provide further understanding of the invention and are incorporated in and constitute a part of this specification, illustrate embodiments of the invention and together with the description serve to explain the principles of the invention. In the drawings:

FIGS. 3a-3e illustrate a method of measuring three-dimensional devices in a wafer in accordance with one aspect of the subject disclosure;

DETAILED DESCRIPTION OF THE INVENTION

In the following detailed description, numerous specific details are set forth to provide a full understanding of the present invention. It will be apparent, however, to one ordinarily skilled in the art that the present invention may be practiced without some of these specific details. In other instances, well-known structures and techniques have not been shown in detail to avoid unnecessarily obscuring the present invention.

Figure 1A:
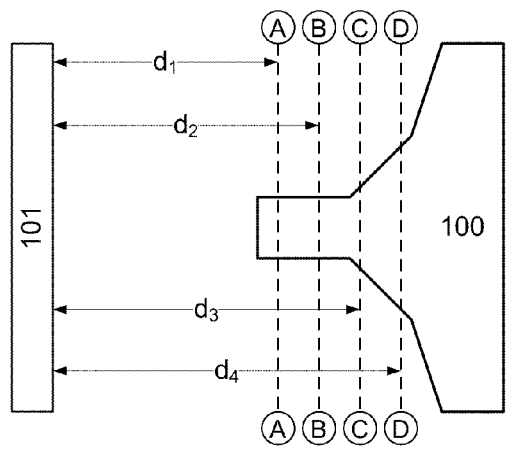
FIGS. 1a-1e illustrate a "slice and view" method of measuring a 3D device in a wafer.
Figure 1B:
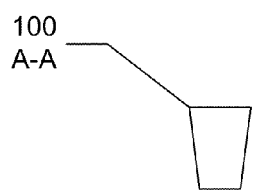
Figure 1C:
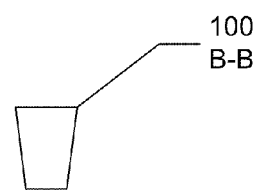
Figure 1D:
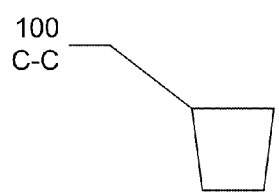
Figure 1E:
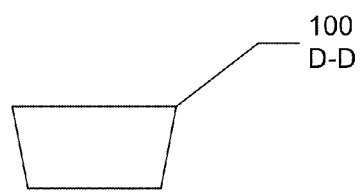
Figure 2:
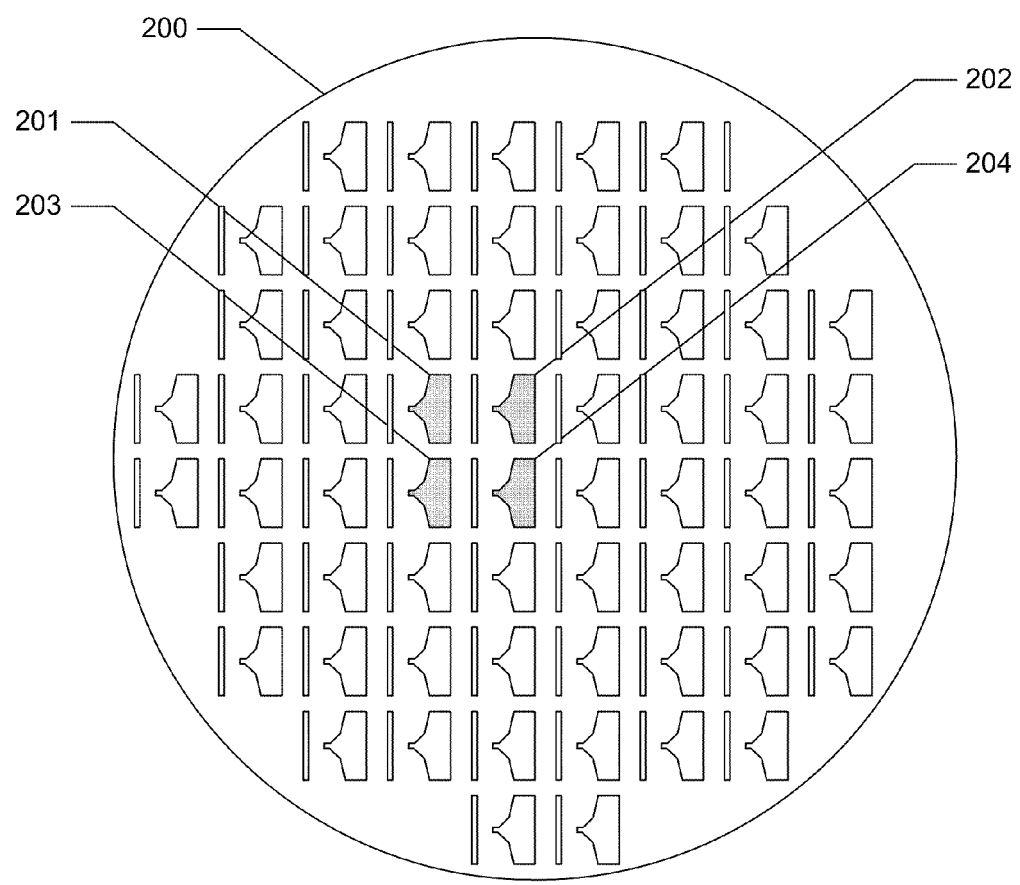
FIG. 2 illustrates a wafer including a plurality of 3D devices in accordance with one aspect of the subject disclosure.

FIG. 2 illustrates an exemplary wafer layout in which a plurality of 3D devices are disposed, in accordance with one aspect of the subject disclosure. Wafer 200 includes a plurality of devices with substantially identical geometries (e.g., devices with the same design parameters, and which are different from one another to the extent that process variations dictate). To determine the geometry of the devices, cross-sectional images from several nearby devices, such as devices 201-204, can be taken and reconstructed to provide composite information about the shape of all the devices. According to one aspect of the subject disclosure, nearby devices are chosen for this process to minimize variations in device geometry that might exist due to local process variations (e.g., wafer level operations may have slightly different effects from one side of the wafer to the other). The nearby devices may be immediately adjacent, or within a predetermined distance, or arranged in a line, or the like.

Turning to FIG. 3a, close up view of devices 201-204 is provided in accordance with one aspect of the subject disclosure. As can be seen with reference to FIG. 3a, a single slice is made in each device, at a different distance from a fiducial thereof. In particular, a slice is made in device 201 along plane A-A a distance $d_1$ from fiducial 211, a slice is made in device 202 along plane B-B a distance $d_2$ from fiducial 212, a slice is made in device 203 along plane C-C a distance $d_3$ from fiducial 213, and a slice is made in device 204 along plane D-D a distance $d_4$ from fiducial 214. Each of these cuts can provide a cross sectional view of the respective write pole, as illustrated in FIGS. 3b-3e. In this regard, a cross-sectional view of write pole 201 in plane A-A is illustrated in FIG. 3b, a cross-sectional view of write pole 202 in plane B-B is illustrated in FIG. 3c, a cross-sectional view of write pole 203 in plane C-C is illustrated in FIG. 3d, a cross-sectional view of write pole 204 in plane D-D is illustrated in FIG. 3e. From these cross-sectional views of each write pole, information regarding the 3D structures thereof can be determined.

According to one exemplary aspect of the subject disclosure, the slicing or trenching of the devices performed to expose a cross-sectional view thereof may be accomplished with focused ion beam milling. In accordance with other aspects of the subject disclosure, however, any one of a number of milling techniques well known to those of skill in the art may be used to expose a cross-sectional view of a 3D device in a wafer. Once the cross-sectional surface of the 3D device is exposed by milling, the measurement or detection of the cross-sectional view thereof may be performed using a scanning electron microscope. In accordance with other aspects of the subject disclosure, however, other imaging techniques well known to those of skill in the art may be utilized to obtain cross-sectional images of the device or to measure the dimensions thereof.

The planes A-A, B-B, C-C and D-D illustrated in FIG. 3a may be made at nearly any angle with respect to the surface of the wafer, in accordance with one aspect of the subject disclosure. In this regard, information regarding the 3D structure of the devices in the wafer may be obtained by exposing cross-sectional views of the devices which are angled more than 90°, less than 90°, or at a right angle to the surface of the wafer. According to another aspect of the subject disclosure, the planes A-A, B-B, C-C and D-D are parallel to one another.

While in the foregoing exemplary embodiment, the metrology and 3D reconstruction of devices in a wafer has been illustrated as involving four nearby devices each sliced a single time to provide four cross-sectional images for determining the geometry of the devices, the scope of the present invention is not limited to this particular arrangement. Rather, as will be readily apparent to those of skill in the art, any number of devices (greater than one) may be sliced to provide information about the geometry of those devices. By increasing the number of slices (and/or the number of devices sliced), higher resolution information regarding the geometry of the devices can be obtained. Moreover, each of the more than one devices used to obtain composite information may be sliced in more than one location, so long as the slices are sufficiently distal from one another on the same device so that the measurement of the cut placement is not adversely affected by the foregoing slices.

Figure 4:
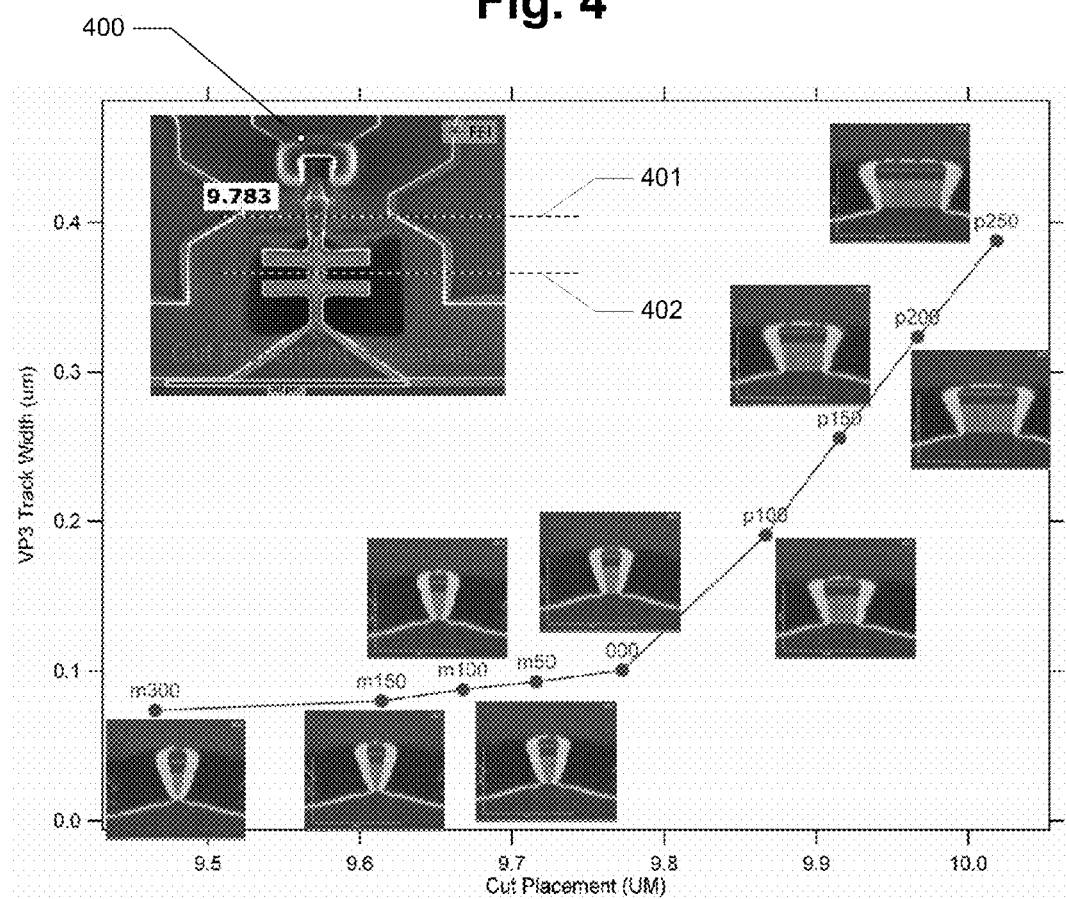
FIG. 4 is a chart illustrating the geometry of a 3D device in a wafer in accordance with one aspect of the subject disclosure.

Turning to FIG. 4, the determination of the geometry of the devices in the wafer is graphically illustrated in accordance with one aspect of the subject disclosure. In this regard, FIG. 4 is a chart illustrating a change in the track width of a VP3 write pole 400 with respect to distance from an air bearing surface 401 thereof. The air bearing surface 401 is a known distance from fiducial structure 402, from which the cut placement (indicated along the x-axis of the chart) is measured in μm. Each data point on the chart represents information obtained from a cross-sectional image of a different device on the same wafer, whereby composite information regarding the 3D geometry of all of the measured devices (and, by extension, all of the devices on the wafer with substantially identical geometry) is obtained.

While FIG. 4 has illustrated composite information about the geometry of VP3 write poles in a wafer, the scope of the present invention is not limited to the metrology and 3D reconstruction of only these devices. Rather, as will be readily apparent to those of skill in the art, the present invention has application to the metrology and 3D reconstruction of any devices in a wafer, insofar as the devices have substantially identical geometries (at least with respect to the portions of those devices for which 3D reconstruction is desirable to carry out).

Figure 5:
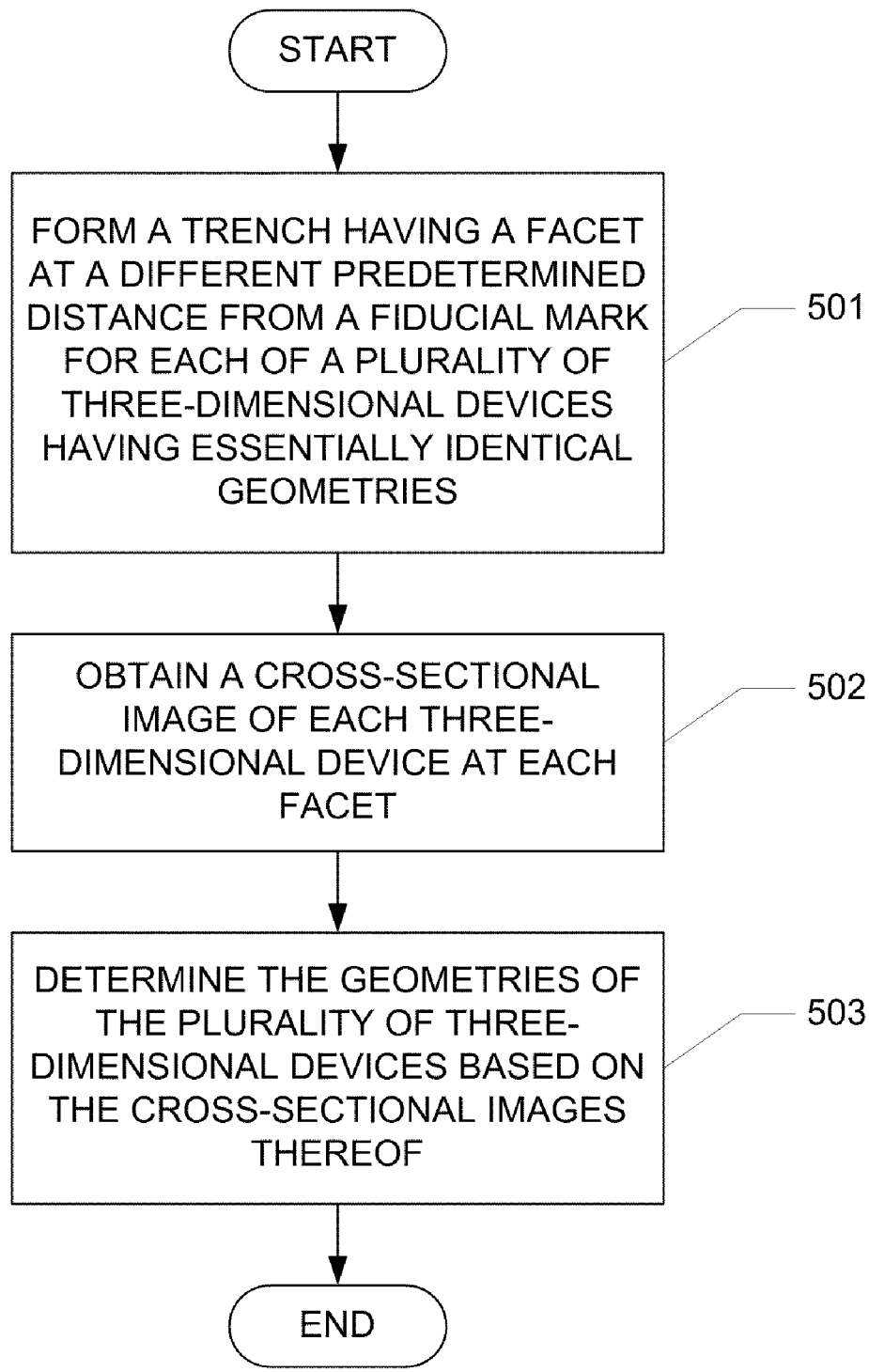
FIG. 5 is a flow chart illustrating a method of measuring three-dimensional devices in a wafer in accordance with one aspect of the subject disclosure.

Turning to FIG. 5, a flow chart illustrates a method of measuring three-dimensional devices in a wafer in accordance with one aspect of the subject disclosure. The method begins with step 501, in which a trench having a facet is formed in each of a plurality of three-dimensional devices in a wafer, each facet being a different predetermined distance from a fiducial mark of the respective device. The devices have essentially identical geometries (e.g., devices with the same design parameters, and which are different from one another to the extent that process variations dictate). In step 502, a cross-sectional image is obtained of each three-dimensional device at its respective facet. In step 503, the geometries of the three-dimensional devices are determined based on the cross-sectional images obtained in step 502.

Figure 6:
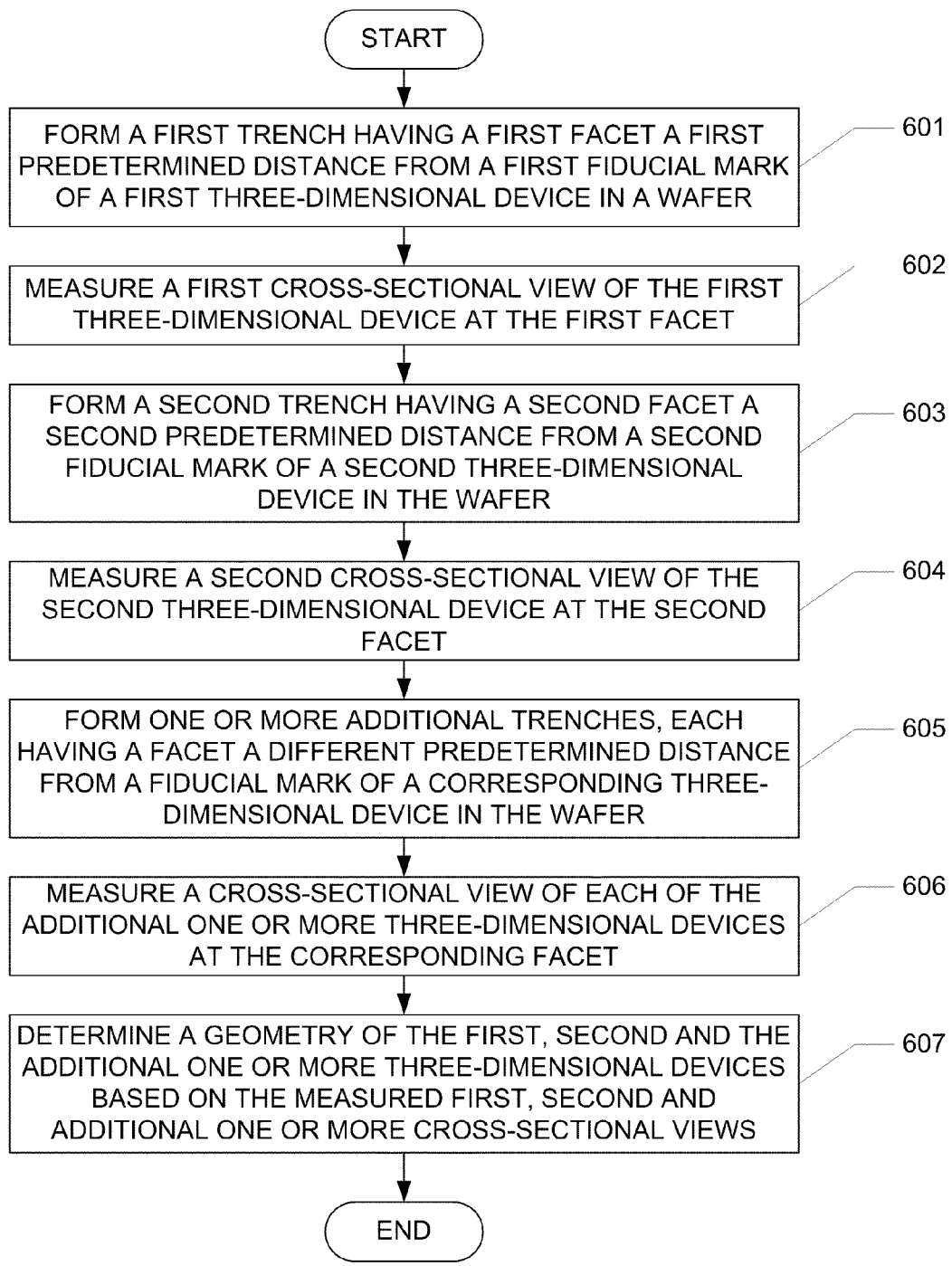
FIG. 6 is a flow chart illustrating a method of measuring three-dimensional devices in a wafer in accordance with one aspect of the subject disclosure.

Turning to FIG. 6, a flow chart illustrates a method of measuring three-dimensional devices in a wafer in accordance with one aspect of the subject disclosure. The method begins with step 601, in which a first trench with a first facet is formed in a first three-dimensional device in a wafer. The first facet is formed at a first predetermined distance from a first fiducial mark of the first three-dimensional device. In step 602, a first cross-sectional view of the first three-dimensional device is measured at the first facet. In step 603, a second trench with a second facet is formed in a second three-dimensional device in the wafer. The second facet is formed at a second predetermined distance from a second fiducial mark of the second three-dimensional device. The second predetermined distance is different than the first predetermined distance. In step 604, a second cross-sectional view of the second three-dimensional device is measured at the second facet. In step 605, additional trenches with facets may optionally be formed in corresponding additional three-dimensional devices in the wafer. The facet of each trench is formed a different predetermined distance from a fiducial mark in the corresponding three-dimensional device. The predetermined distance of each facet in the additional one or more trenches is different than the first and second predetermined distances. In step 606, cross-sectional views of the additional three-dimensional devices are measured at the corresponding facets. In step 607, the geometry of the first, second and additional one or more three-dimensional devices is determined based on the measured first, second and additional one or more cross-sectional views.

Figure 7:
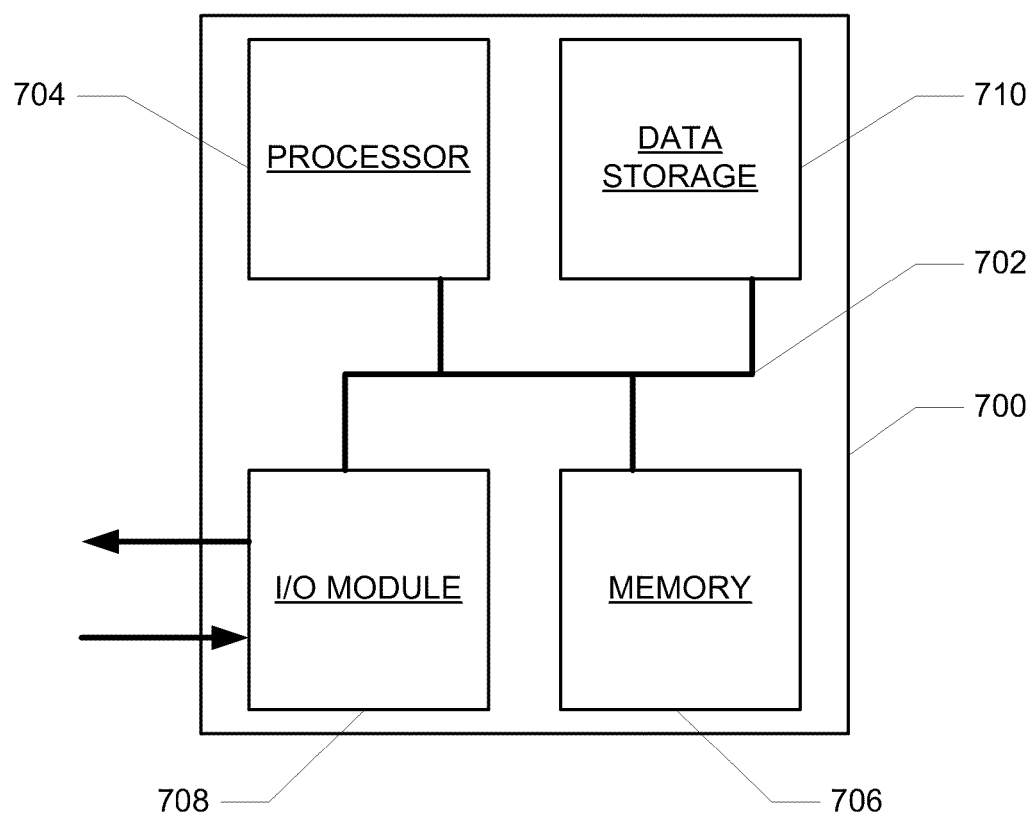
FIG. 7 is a block diagram that illustrates a computer system upon which one embodiment of the present invention may be implemented.

FIG. 7 is a block diagram that illustrates a computer system 700 upon which an embodiment of the present invention may be implemented. Computer system 700 includes a bus 702 or other communication mechanism for communicating information, and a processor 704 coupled with bus 702 for processing information. Computer system 700 also includes a memory 706, such as a random access memory ("RAM") or other dynamic storage device, coupled to bus 702 for storing information and instructions to be executed by processor 704. Memory 706 may also be used for storing temporary variables or other intermediate information during execution of instructions by processor 704. Computer system 700 further includes a data storage device 710, such as a magnetic disk or optical disk, coupled to bus 702 for storing information and instructions.

Computer system 700 may be coupled via I/O module 708 to a display device (not illustrated), such as a cathode ray tube ("CRT") or liquid crystal display ("LCD") for displaying information to a computer user. An input device, such as, for example, a keyboard or a mouse may also be coupled to computer system 700 via I/O module 708 for communicating information and command selections to processor 704.

According to one embodiment of the present invention, measuring three-dimensional devices in a wafer is performed by a computer system 700 in response to processor 704 executing one or more sequences of one or more instructions contained in memory 706. Such instructions may be read into memory 706 from another machine-readable medium, such as data storage device 710. Execution of the sequences of instructions contained in main memory 706 causes processor 704 to perform the process steps described herein. One or more processors in a multi-processing arrangement may also be employed to execute the sequences of instructions contained in memory 706. In alternative embodiments, hard-wired circuitry may be used in place of or in combination with software instructions to implement various embodiments of the present invention. Thus, embodiments of the present invention are not limited to any specific combination of hardware circuitry and software.

The term "machine-readable medium" as used herein refers to any medium that participates in providing instructions to processor 704 for execution. Such a medium may take many forms, including, but not limited to, non-volatile media, volatile media, and transmission media. Non-volatile media include, for example, optical or magnetic disks, such as data storage device 710. Volatile media include dynamic memory, such as memory 706. Transmission media include coaxial cables, copper wire, and fiber optics, including the wires that comprise bus 702. Transmission media can also take the form of acoustic or light waves, such as those generated during radio frequency and infrared data communications. Common forms of machine-readable media include, for example, floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM, a FLASH EPROM, any other memory chip or cartridge, a carrier wave, or any other medium from which a computer can read.

The description of the invention is provided to enable any person skilled in the art to practice the various embodiments described herein. While the present invention has been particularly described with reference to the various figures and embodiments, it should be understood that these are for illustration purposes only and should not be taken as limiting the scope of the invention.

There may be many other ways to implement the invention. Various functions and elements described herein may be partitioned differently from those shown without departing from the spirit and scope of the invention. Various modifications to these embodiments will be readily apparent to those skilled in the art, and generic principles defined herein may be applied to other embodiments. Thus, many changes and modifications may be made to the invention, by one having ordinary skill in the art, without departing from the spirit and scope of the invention.

A reference to an element in the singular is not intended to mean "one and only one" unless specifically stated, but rather "one or more." The term "some" refers to one or more. Underlined and/or italicized headings and subheadings are used for convenience only, do not limit the invention, and are not referred to in connection with the interpretation of the description of the invention. All structural and functional equivalents to the elements of the various embodiments of the invention described throughout this disclosure that are known or later come to be known to those of ordinary skill in the art are expressly incorporated herein by reference and intended to be encompassed by the invention. Moreover, nothing disclosed herein is intended to be dedicated to the public regardless of whether such disclosure is explicitly recited in the above description.

What is claimed is:

1. A method for measuring three-dimensional devices in a wafer, comprising the steps of:

obtaining a plurality of cross-sectional images of a corresponding plurality of three-dimensional devices in the wafer, wherein the plurality of three-dimensional devices have essentially identical geometries, wherein each cross-sectional image is obtained from a plane in the corresponding three-dimensional device at a predetermined distance from a fiducial mark thereof, and wherein the predetermined distance is different for each of the plurality of cross-sectional images; and determining the geometries of the plurality of three-dimensional devices based on the cross-sectional images thereof.

2. The method according to claim 1, wherein obtaining each of the plurality of cross-sectional images comprises:

forming a trench having a facet at the predetermined distance from the fiducial mark of the corresponding three-dimensional device; and measuring a cross-sectional view of the three-dimensional device at the facet.

3. The method according to claim 2, wherein the forming the trench comprises focused ion beam milling.

4. The method according to claim 2, wherein the measuring the cross-sectional view comprises scanning electron microscopy.

5. The method according to claim 1, wherein the plurality of three-dimensional devices are adjacent to one another on the wafer.

6. The method according to claim 1, wherein the determining the geometries of the plurality of three-dimensional devices comprises determining a difference in dimension among the plurality of three-dimensional devices based upon a difference between the corresponding distances from the fiducial marks thereof.

7. The method according to claim 1, wherein the three-dimensional devices comprise writer poles.

8. The method according to claim 1, wherein the plurality of planes from which the plurality of cross-sectional images are obtained are parallel.

9. The method according to claim 1, wherein the plurality of planes from which the plurality of cross-sectional images are obtained are normal to a surface of the wafer.

10. The method according to claim 1, wherein only a single cross-sectional image is obtained for each of the plurality of three-dimensional devices.

11. A method for measuring three-dimensional devices in a wafer, comprising the steps of:

forming a first trench having a first facet a first predetermined distance from a first fiducial mark of a first three-dimensional device in the wafer;

measuring a first cross-sectional view of the first three-dimensional device at the first facet;

forming a second trench having a second facet a second predetermined distance from a second fiducial mark of a second three-dimensional device in the wafer, the second three-dimensional device being essentially identical in shape to the first three-dimensional device;

measuring a second cross-sectional view of the second three-dimensional device at the second facet; and determining a geometry of the first and second three-dimensional devices based on the measured first and second cross-sectional views.

12. The method according to claim 11, wherein the forming the first trench and the second trench comprises focused ion beam milling.

13. The method according to claim 11, wherein the measuring the first cross-sectional view and the second cross-sectional view comprises scanning electron microscopy.

14. The method according to claim 11, wherein the first and second three-dimensional devices are adjacent to one another on the wafer.

15. The method according to claim 11, wherein the determining the geometry of the first and second three-dimensional devices comprises determining a difference in dimension between the first and second three-dimensional devices based upon a difference between the first and second predetermined distances.

16. The method according to claim 11, further comprising the steps of:

forming an additional one or more trenches, each having a corresponding facet a different predetermined distance from a fiducial mark of a corresponding three-dimensional device in the wafer, each of the additional one or more three-dimensional devices being essentially identical in shape to the first and second three-dimensional devices; and measuring a cross-sectional view of each of the additional one or more three-dimensional devices at the corresponding facet, wherein the determining the geometry of the first and second three-dimensional devices comprises determining the geometry of the first, second and additional one or more three-dimensional devices based on the measured first, second and additional one or more cross-sectional views.

17. The method according to claim 11, wherein the first and second three-dimensional devices comprise first and second writer poles.

18. The method according to claim 11, wherein the plurality of planes from which the plurality of cross-sectional images are obtained are parallel.

19. The method according to claim 11, wherein the plurality of planes from which the plurality of cross-sectional images are normal to a surface of the wafer.

20. The method according to claim 11, wherein only a single cross-sectional image is obtained for each of the plurality of three-dimensional devices.

21. A machine readable medium carrying one or more sequences of instructions for measuring three-dimensional devices in a wafer, wherein execution of the one or more sequences of instructions by one or more processors causes the one or more processors to perform the steps of:

obtaining a plurality of cross-sectional images of a corresponding plurality of three-dimensional devices in the wafer, wherein the plurality of three-dimensional devices have essentially identical geometries, wherein each cross-sectional image is obtained from a plane in the corresponding three-dimensional device at a predetermined distance from a fiducial mark thereof, and wherein the predetermined distance is different for each of the plurality of cross-sectional images; and determining the geometries of the plurality of three-dimensional devices based on the cross-sectional images thereof.

* * * * *